US008919755B2

(12) United States Patent
Shim et al.

(10) Patent No.: US 8,919,755 B2
(45) Date of Patent: Dec. 30, 2014

(54) HI-FIX BOARD CLAMPING APPARATUS FOR USE IN TEST HANDLER

(75) Inventors: Jae Gyun Shim, Suwon-si (KR); Yun Sung Na, Cheonan-si (KR); In Gu Jeon, Suwon-si (KR); Tae Hung Ku, Suwon-si (KR); Dong Han Kim, Suwon-si (KR)

(73) Assignee: Techwing Co. Ltd., Hwaseong-si (KR)

( * ) Notice: Subject to any disclaimer, the term of this patent is extended or adjusted under 35 U.S.C. 154(b) by 1880 days.

(21) Appl. No.: 11/652,181

(22) Filed: Jan. 11, 2007

(65) Prior Publication Data

US 2008/0061485 A1 Mar. 13, 2008

(30) Foreign Application Priority Data

Aug. 22, 2006 (KR) ........................ 20-2006-0022522

(51) Int. Cl.
*H01L 21/687* (2006.01)
*B25B 5/00* (2006.01)

(52) U.S. Cl.
CPC ................ *B25B 5/006* (2013.01); *Y10S 269/90* (2013.01)
USPC ............................................. 269/21; 269/900

(58) Field of Classification Search
USPC .......... 269/903, 20, 21, 289 R, 900; 451/364, 451/365
See application file for complete search history.

(56) References Cited

U.S. PATENT DOCUMENTS

| | | | | | |
|---|---|---|---|---|---|
| 1,016,594 | A | * | 2/1912 | Woodman | 144/84 |
| 2,430,613 | A | * | 11/1947 | Hodge | 269/138 |
| 3,473,420 | A | * | 10/1969 | Boggs | 408/72 R |
| 4,170,345 | A | * | 10/1979 | Townsend | 269/88 |
| 4,647,027 | A | * | 3/1987 | Shafto | 269/100 |
| 4,867,427 | A | * | 9/1989 | Cunningham | 269/88 |
| 4,901,990 | A | * | 2/1990 | Frechette | 269/25 |
| 4,971,676 | A | * | 11/1990 | Doue et al. | 118/503 |
| 5,044,615 | A | * | 9/1991 | Newman et al. | 269/231 |
| 5,180,150 | A | * | 1/1993 | Prusak et al. | 269/254 R |
| 5,362,036 | A | * | 11/1994 | Whiteman | 269/51 |
| 5,501,436 | A | * | 3/1996 | Miller | 269/47 |
| 5,538,231 | A | * | 7/1996 | Baldwin et al. | 269/304 |
| 5,848,490 | A | * | 12/1998 | Lee | 40/757 |
| 5,961,107 | A | * | 10/1999 | Morghen | 269/47 |
| 6,328,296 | B2 | * | 12/2001 | Tyveleijn | 269/297 |
| 6,702,269 | B1 | * | 3/2004 | Tadich | 269/37 |
| 6,792,675 | B2 | * | 9/2004 | Tran | 29/760 |
| 6,845,974 | B2 | * | 1/2005 | Bidaud | 269/91 |
| 2008/0061485 | A1 | * | 3/2008 | Shim et al. | 269/20 |

FOREIGN PATENT DOCUMENTS

JP 2001021613 1/2001

* cited by examiner

*Primary Examiner* — Lee D Wilson
(74) *Attorney, Agent, or Firm* — BainwoodHuang

(57) ABSTRACT

A clamping apparatus for clamping a plurality of Hi-Fix boards arranged in a row, includes at least one rotational clamping unit installed to clamp facing end sides of the two or more Hi-Fix boards together, and a plurality of clamping units installed to clamp end sides of the Hi-Fix boards other than the facing sides thereof. The rotational clamping unit includes a clamper installed to rotate about a fixed rotation point to clamp or release the claming of the facing end sides of the two or more Hi-Fix boards, and a driving unit for providing a rotational force to the clamper.

3 Claims, 9 Drawing Sheets

HI-FIX BOARD CLAMPING APPARATUS FOR USE IN TEST HANDLER

FIELD OF THE INVENTION

The present invention relates to a Hi-Fix board clamping apparatus for use in a test handler.

BACKGROUND OF THE INVENTION

In general, a test handler is used for supporting a tester for testing semiconductor devices fabricated through a preset manufacturing process. The test handler classifies the fabricated semiconductor devices into several classes according to their test results and serves to load those classified devices onto customer trays. Such a test handler has been already known through various published documents.

FIG. 1 shows a schematic perspective view of a conventional test handler 100, and FIG. 2 sets forth a conceptual diagram of major components of the test handler 100 viewed from top. Below, major components of the conventional test handler 100 will be described schematically with reference to FIGS. 1 and 2.

Referring to FIG. 1, the conventional test handler 100 includes a loading unit 110, a soak chamber 120, a test chamber 130, a desoak chamber 140, an unloading unit 150 and a press unit 160.

Further, as shown in FIG. 2, disposed behind the test chamber 130 is a tester 170 for testing semiconductor devices placed on a test tray within the test chamber 130.

FIG. 3 presents a schematic view of the tester shown in FIG. 2. As shown in FIG. 3, the tester 170 includes two Hi-Fix boards 171*a* and 171*b* installed at an upper and a lower part of a single test head 172, respectively, wherein each Hi-Fix board 171*a* (171*b*) has a number of test sockets 171-1 arranged in a matrix pattern. Each of the Hi-Fix boards 171*a* and 171*b* is configured to correspond to one of test trays 11*a* and 11*b*, respectively.

Hereinafter, an operation of the test handler 100 having the above configuration will be explained.

Semiconductor devices loaded in customer trays 10*a* are transferred to and loaded into a test tray in loading positions by the loading unit 110.

The test tray passed through the soak chamber 120 for pre-heating or pre-cooling are and transferred to the test chamber 130. Then, two test trays 11*a* and 11*b* are arranged at upper and lower two stage positions, respectively, as illustrated in FIGS. 1 and 2. Subsequently, the press unit 160 pushes the test trays 11*a* and 11*b* toward the tester 170 to allow the test trays 11*a* and 11*b* to be brought into firm contact with the Hi-Fix boards 171*a* and 171*b* of the tester 170, respectively (to be more specific, the semiconductor devices loaded on the test trays are brought into firm contact with test sockets arranged on the Hi-Fix boards). Then, after conducting the test of the semiconductor devices by means of the tester 170, the test tray is passed through the desoak chamber 140 to recover its original temperature and transferred to unloading position. Thereafter, the semiconductor devices loaded on the test tray in the unloading position are unloaded onto the customer trays 10*b* by the unloading unit 150, and the test tray is returned from the unloading position to the loading positions.

In the above process, when the test trays 11*a* and 11*b* are brought into contact with the Hi-Fix boards 17*a* and 17*b* by the press unit 160, a firm contact therebetween cannot be obtained if the Hi-Fix boards 171*a* and 171*b* are not securely fastened to the test chamber 130, which results in a failure to enable appropriate contact between the semiconductor devices and the test sockets 171-1. Thus, a clamping apparatus is used to firmly fasten the Hi-Fix boards 171*a* and 171*b* to the test chamber 130.

FIG. 4 presents a schematic diagram to describe a conventional clamping apparatus.

As shown in FIG. 4, the conventional clamping apparatus has four clamping units 190 for each of the Hi-Fix boards 171*a* and 171*b*. Each clamping unit 190 includes a cylinder 191; and a clamper 192 connected to a piston rod 191*a* of the cylinder 191 and moved to-and-fro to clamp the end sides of corresponding one of the Hi-Fix boards 171*a* and 171*b*. Four of the eight clamping units 190 clamp or release the clamping of left end sides of the Hi-Fix boards 171*a* and 171*b*, while the other four clamp or release the clamping of right end sides of the Hi-Fix boards 171*a* and 171*b*.

Meanwhile, according to the recent trend for the development of test handlers, the number of semiconductor devices that can be simultaneously measured per a unit time (hereinafter, simply referred to as the number of simultaneous measurements) has been increased to keep up with the increase of the demand for the semiconductor devices. So far, such an increase of the processing speed has been attempted to be achieved by reducing an unnecessary time delay through increasing an operating rate of the loading unit and/or the unloading unit or by testing semiconductor devices loaded in two test trays at one time. In addition, in order to raise the processing speed, it has been attempted to increase the simultaneous measurements by way of enlarging the size of the test trays and thus enabling accommodation of more semiconductor devices therein. However, if the test trays and their relevant components are enlarged, thermal expansion would be expanded accordingly as much as the test trays and the relevant components are enlarged, so that various problems would be caused due to the thermal expansion in addition to other structural problems. Thus, increasing the size of the test trays has been considered to be troublesome. Nevertheless, since the conception of increasing the number of simultaneous measurements by enlarging the size of the test trays has merits, many researches are still being conducted to develop the method, and it is expected that the increase of the test trays in size would be realized in the near future. In case the size of the test trays are enlarged, the size of the High-Fix boards needs to be expanded as well.

However, if the conventional clamping apparatus as shown in FIG. 4 is utilized to firmly fasten the enlarged Hi-Fix board, e.g., 171*a*, to the test handler, a portion of the Hi-Fix board 171*a* near a central line C thereof would be unfastened from the test hander, so that there inevitably occurs a gap between the Hi-Fix board 171*a* and the test handler near the central line ‘C’ of the Hi-Fix board 171*a*, as illustrated in FIG. 5. The presence of the gap would result in a failure to make appropriate contacts between semiconductor devices located at a certain region ‘E’ near the central line ‘C’ and the test sockets when the test tray, e.g., 11*a* is brought into firm contact with the Hi-Fix board 171*a* by the press unit 160, thus hindering the increase of the test trays 11*a* and 11*b* in size.

To solve the problem, if it is attempted to install additional clamping units 190 as shown in FIG. 4 to clamp upper and lower end sides of the Hi-Fix boards 171*a* and 171*b*, it is difficult to clamp the Hi-Fix boards 171*a* and 171*b*’s two opposite sides facing each other because there occurs an interference between the installation space of each cylinder 191 of the clamping units 190 and the space occupied by the Hi-Fix boards 171*a* and 171*b*. However, using a single Hi-Fix board to avoid the interference problem is not viewed as a consideration because it would result in a reduction of the simultaneous measurements.

SUMMARY OF THE INVENTION

It is, therefore, an object of the present invention to provide a Hi-Fix board clamping apparatus for a test handler, capable of claming a central portion of each of a plurality of Hi-Fix boards arranged in a row.

In accordance with an embodiment of the present invention, there is provided a clamping apparatus for clamping two or more Hi-Fix boards arranged in a row, comprising:

at least one rotational clamping unit installed to clamp facing end sides of two or more the Hi-Fix boards together; and a plurality of clamping units installed to clamp end sides of the two or more Hi-Fix boards other than the facing sides thereof, wherein the rotational clamping unit includes:

a clamper installed to rotate about a fixed rotation point to clamp or release the claming of the facing end sides of the two or more Hi-Fix boards together; and a driving unit for providing a rotational force to the clamper.

BRIEF DESCRIPTION OF THE DRAWINGS

The above and other objects and features of the present invention will become apparent from the following description of embodiments given in conjunction with the accompanying drawings, in which.

DETAILED DESCRIPTION OF THE EMBODIMENT

Hereinafter, a Hi-Fix board clamping apparatus for use in a test handler will be described in accordance with an exemplary embodiment of the present invention with reference to the accompanying drawings.

Figure 1:
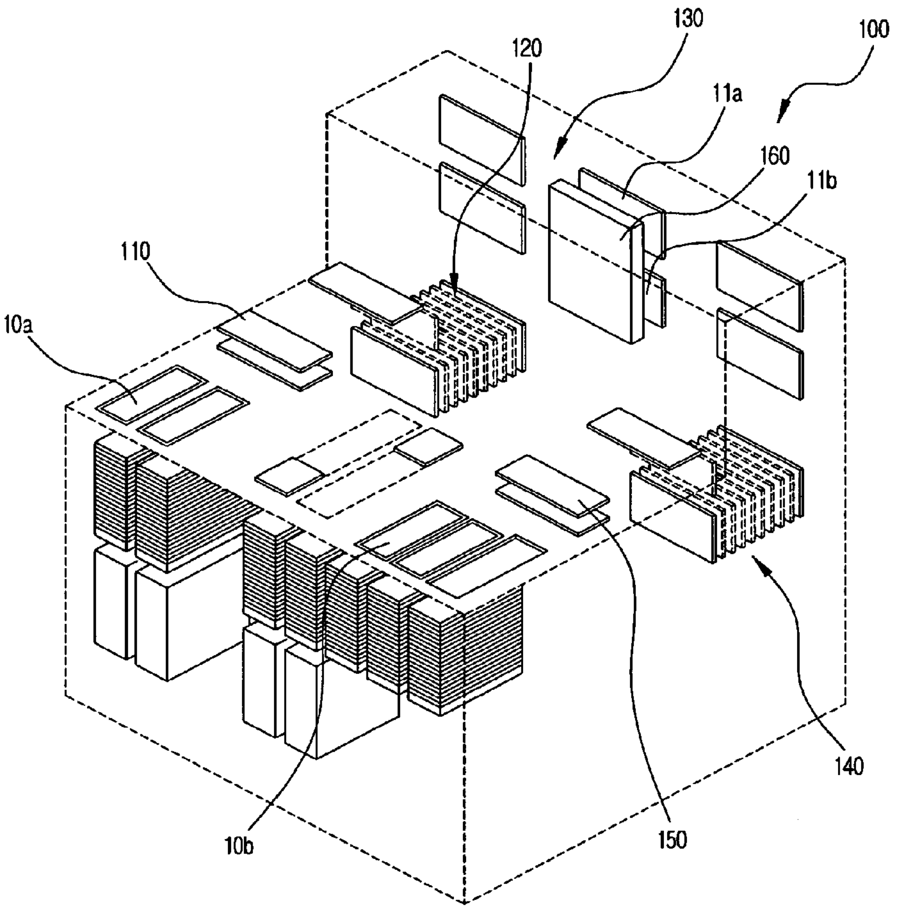
FIG. 1 (PRIOR ART)
FIG. 1 is a schematic perspective view of a conventional test handler.
Figure 2:
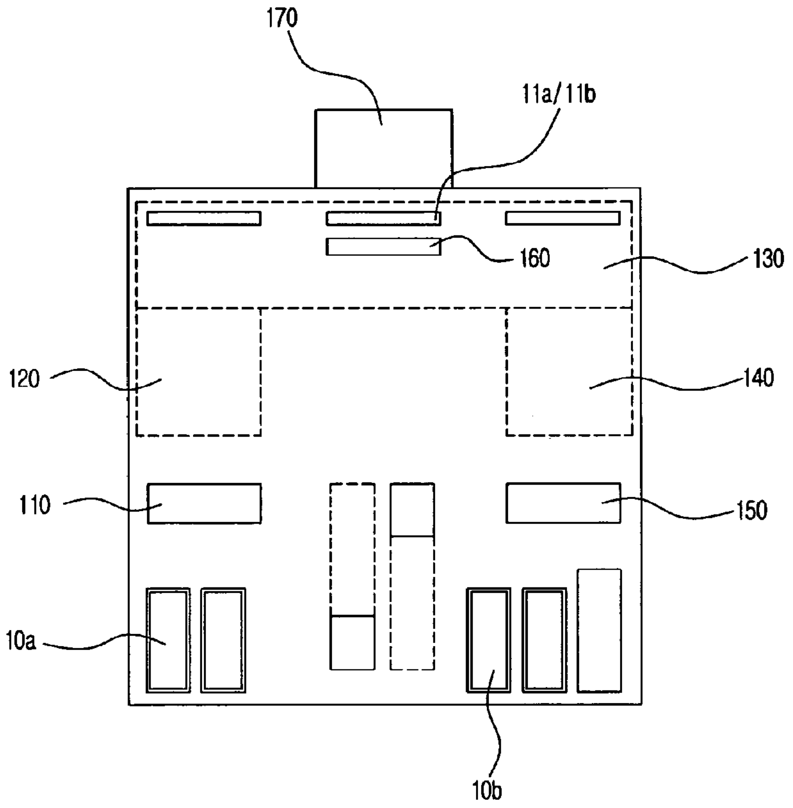
FIG.2 (PRIOR ART)
FIG. 2 sets forth a conceptual diagram of major components of the test hander of FIG. 1 viewed from above.
Figure 3:
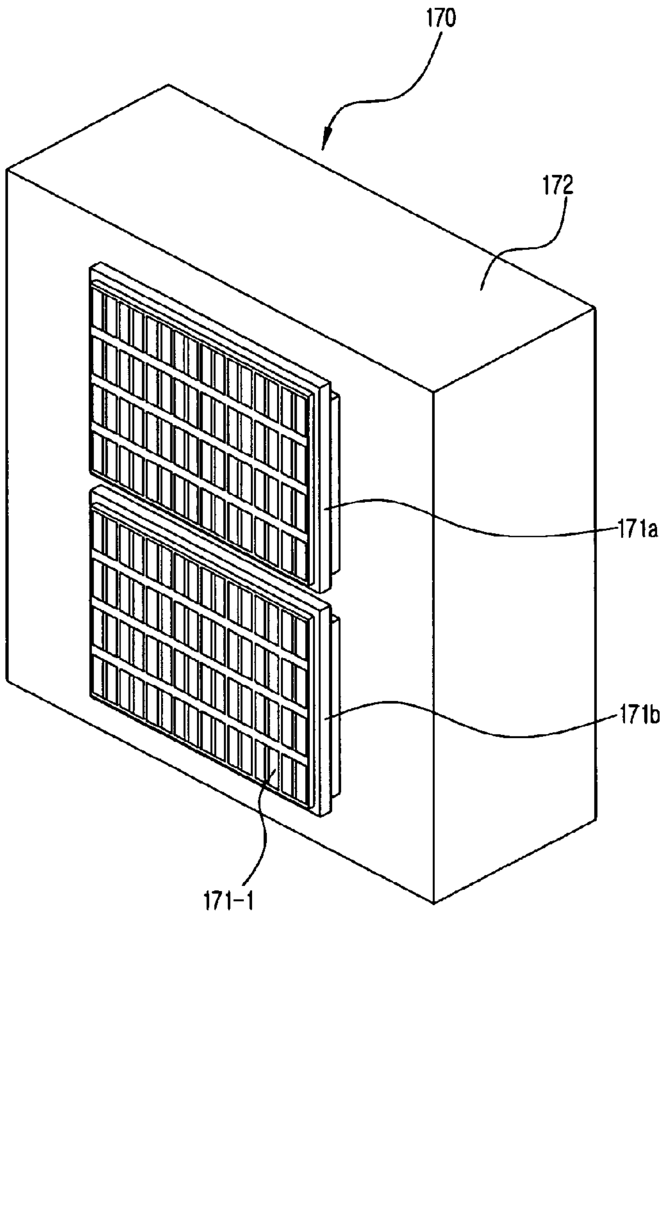
FIG. 3 (PRIOR ART)
FIG. 3 provides a schematic perspective view of a conventional tester coupled to the test handler of FIG. 1.
Figure 4:
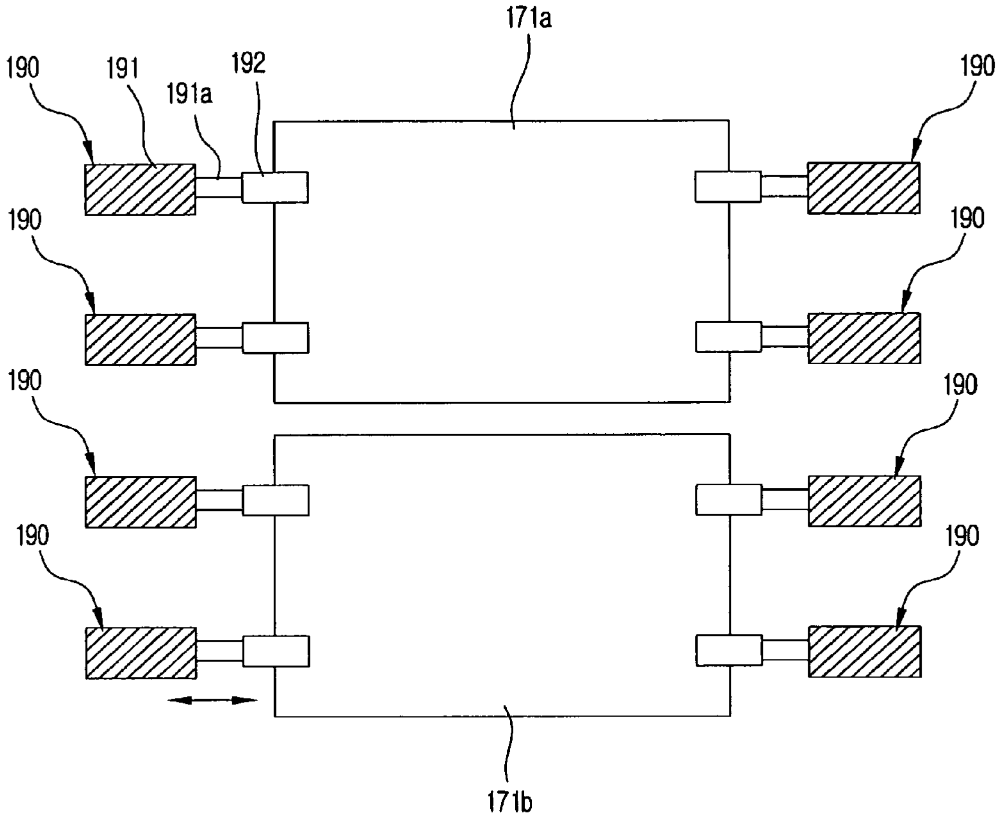
FIG. 4 (PRIOR ART)
FIG. 4 depicts a schematic view of a conventional clamping apparatus employed in the test handler of FIG. 1.
Figure 5:
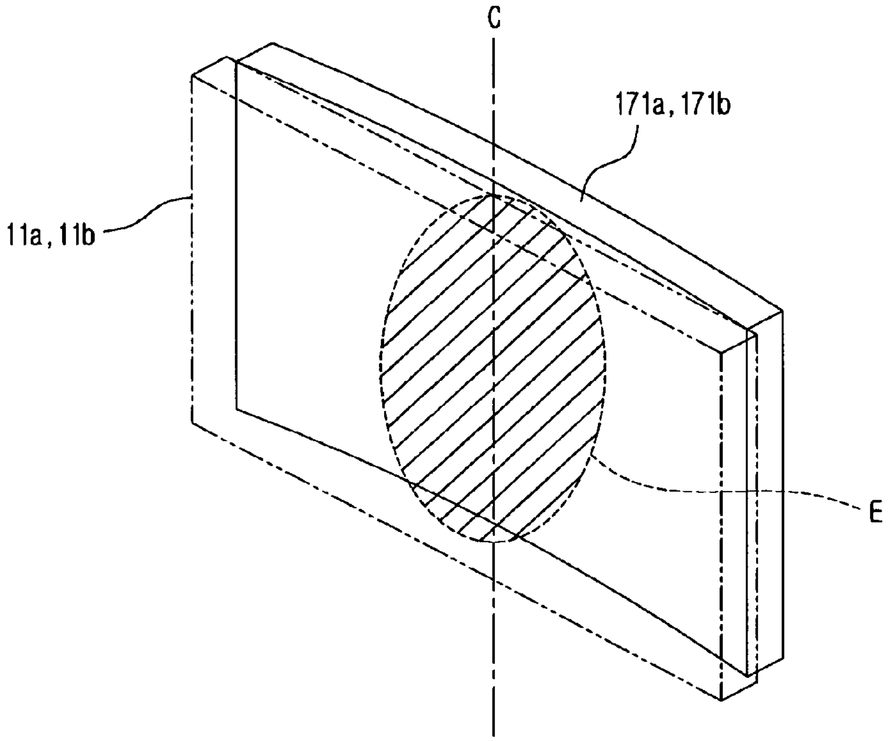
FIG.5 (PRIOR ART)
FIG. 5 presents a diagram for describing a problem of the conventional clamping apparatus of FIG. 4.
Figure 6:
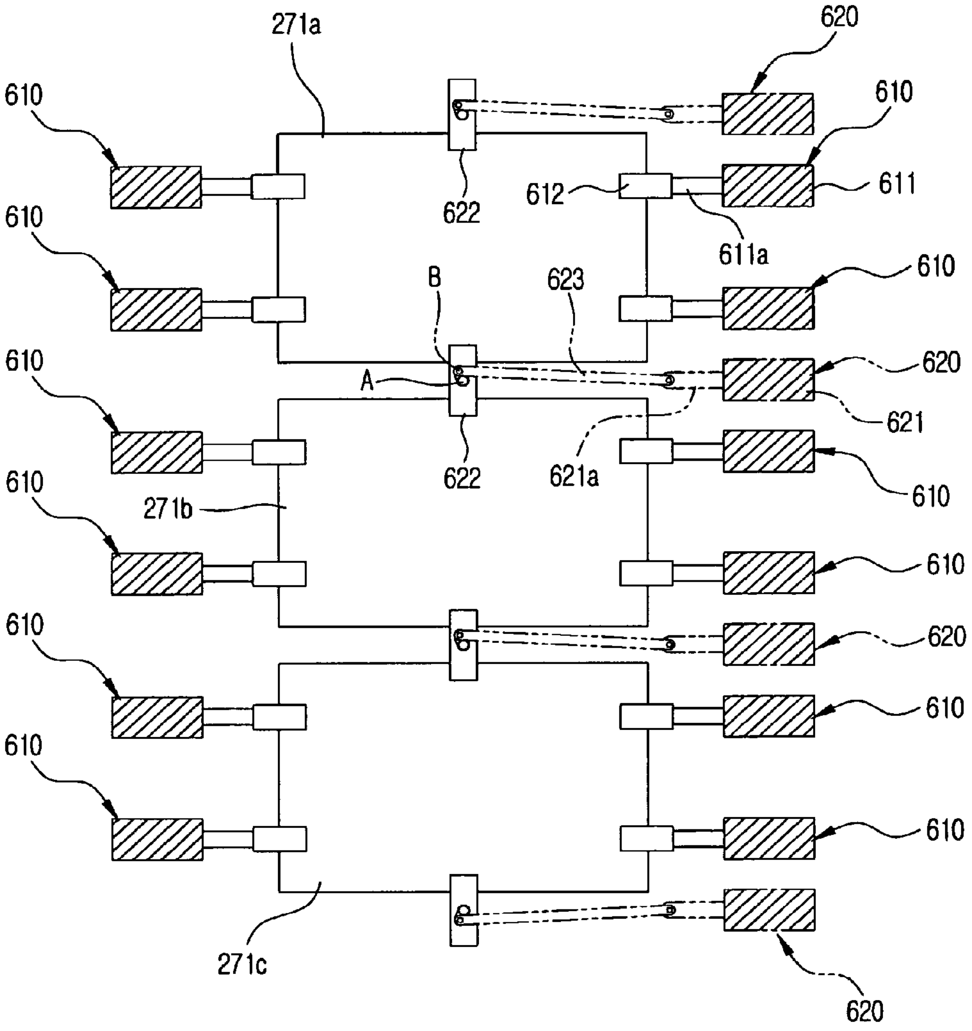
FIG. 6 is a schematic view of a clamping apparatus in accordance with an embodiment of the present invention.

The clamping apparatus in accordance with the embodiment of the present invention is configured to clamp Hi-Fix boards vertically arranged in three levels, and FIG. 6 illustrates a schematic view thereof.

As shown in FIG. 6, the clamping apparatus includes twelve linear clamping units 610 and four rotational clamping units 620.

Each linear clamping unit 610 includes a cylinder 611; and a linear clamper 612 connected to a piston rod 611*a* of the cylinder 611 and linearly moved along with the piston rod 611*a* to clamp left or right end sides of corresponding one of Hi-Fix boards 271*a* to 271*c*. Among the twelve linear clamping units 610, four of them serve to clamp or release the clamping of left and right end sides of the Hi-Fix board 271*a*; another four of them serve to clamp or release the clamping of left and right end sides of the Hi-Fix board 271*b*; and the rest four of them serve to clamp or release the clamping of left or right end sides of the Hi-Fix board 171*c*.

Further, two of the four rotational clamping units 620 serve to clamp or release the clamping of facing end sides of the Hi-Fix boards 271*a*, 271*b* and 271*b*, 271*c* together; and the other two of the four rotational clamping units 620 serve to clamp an upper end side of the Hi-Fix board 271*a* and a lower end side of the Hi-Fix board 271*c*, respectively. Specifically, each rotational clamping unit 620 includes a cylinder 621; a rotational clamper 622; and a connection link 623. The rotational clamper 622 is installed to rotate about a center 'A', and the connection link 623 is rotatably connected at its one end to a piston rod 621*a* of the cylinder 621 and at the other end to a rotational clamper 622's position 'B' deviated from the center 'A' of the clamper 622 by a preset interval. In this configuration, if the cylinder 621 is operated to move the piston rod 621*a* forward or backward, the linear movement is converted into a circular movement by a quadrangular link mechanism, making the rotational clamper 622 rotate about the center 'A'.

Now, an operation of the clamping apparatus having the configuration as described above will be explained with reference to FIGS. 7 to 9.

Figure 7:
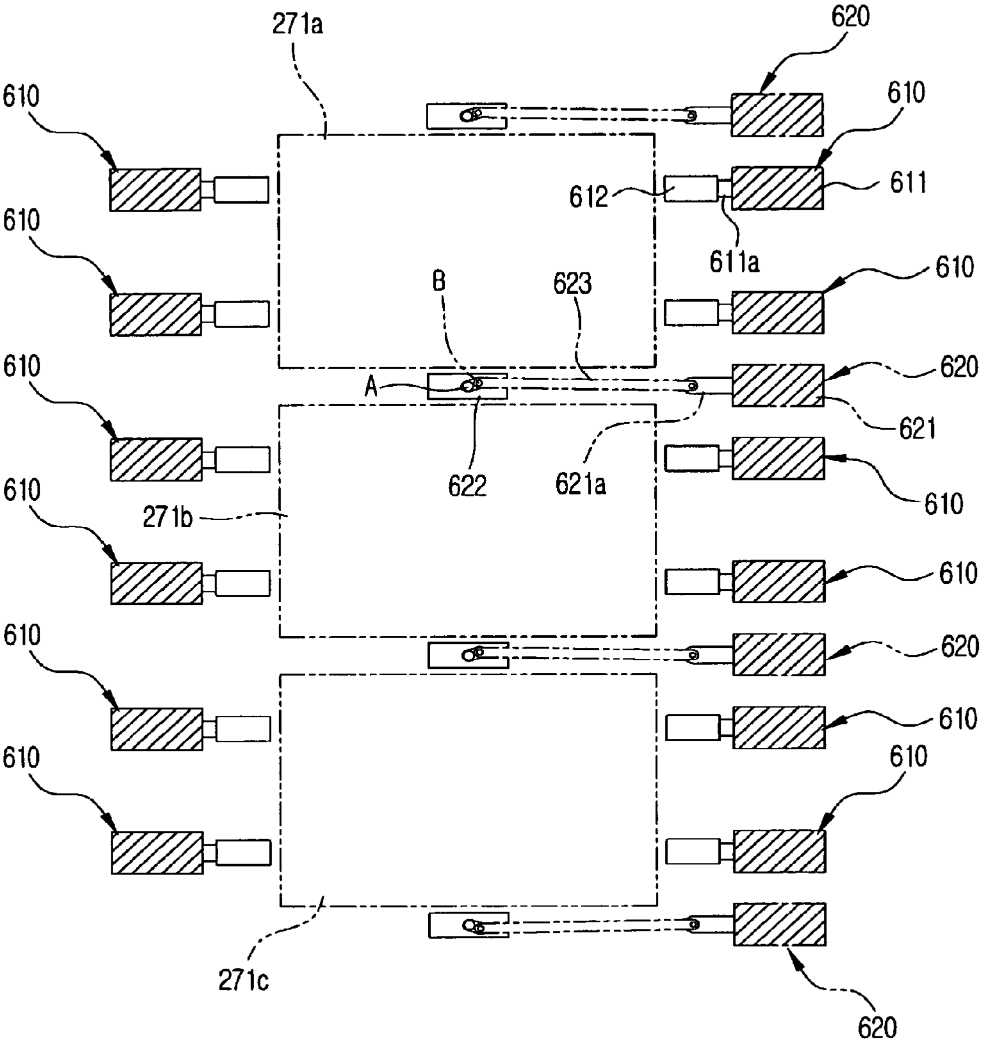
FIGS. 7 to 9 offer diagrams for describing operational status of the clamping apparatus of FIG. 6.

Referring to FIG. 7, before the Hi-Fix boards 271*a* to 271*c* are loaded in their places, the piston rods 611*a* of the cylinders 611 and the piston rods 621*a* of the cylinders 621 are kept at their retrieved positions, maintaining a clamping release state.

Figure 8:
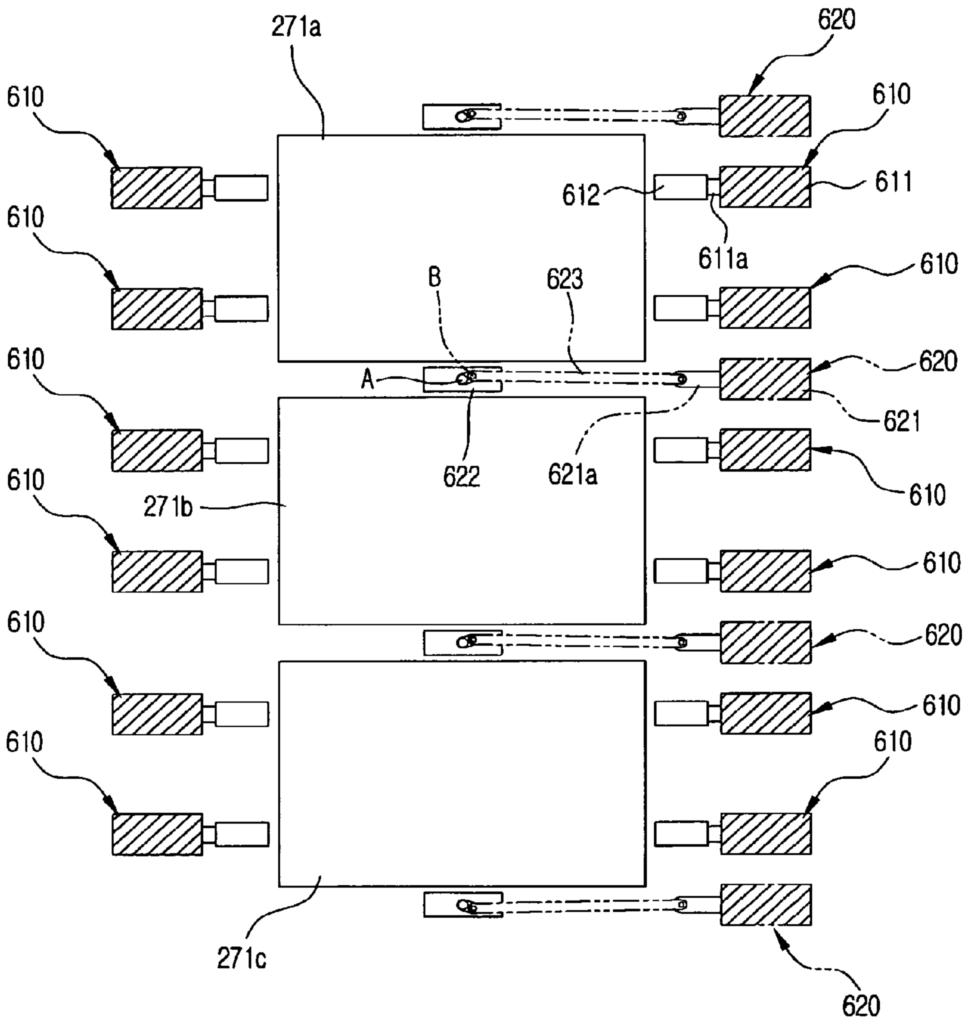
Figure 9:
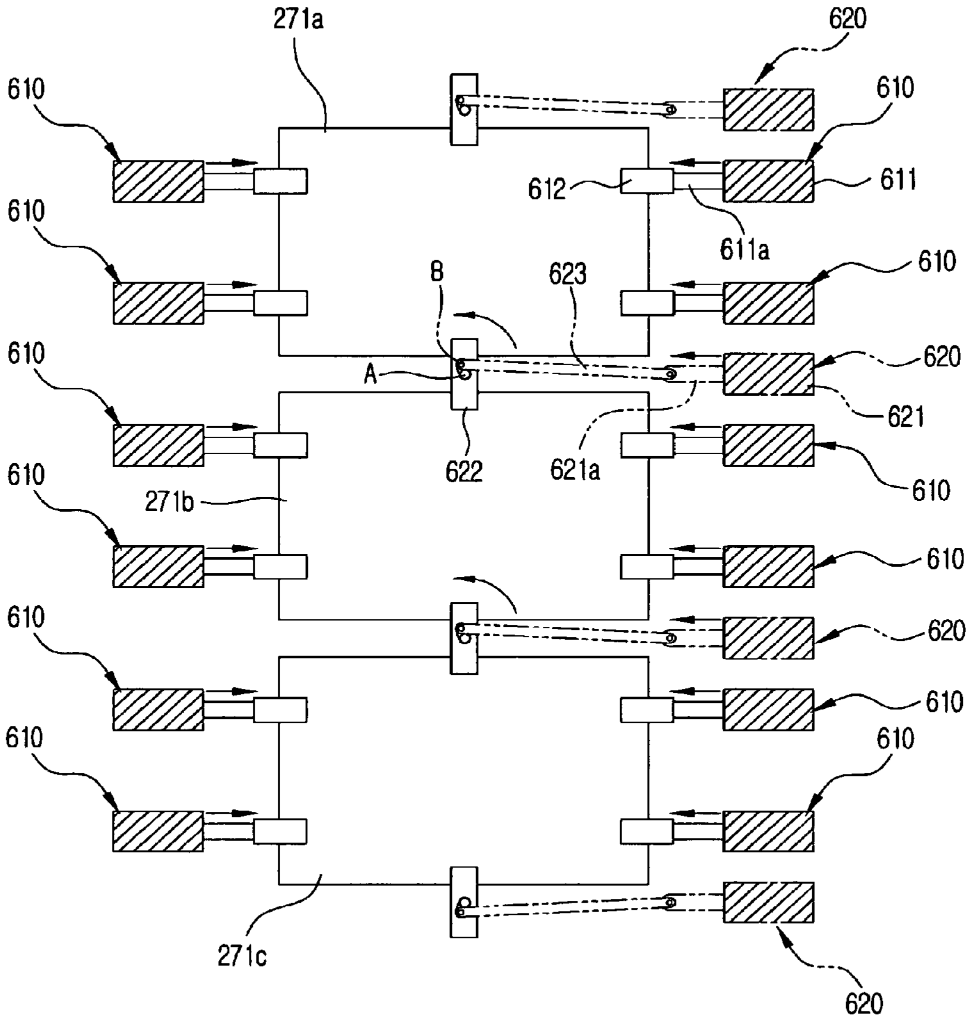

Then, if the Hi-Fix boards 271*a* to 271*c* are loaded in their mounted position as shown in FIG. 8, the clamping units 610 and 620 are operated to clamp the Hi-Fix boards 271*a* to 271*c* as shown in FIG. 9.

As for the linear clamping units 610, their cylinders 611 are operated to make their piston rods 611*a* move forward, whereby the linear clampers 612 are allowed to move forward, while clamping the left or right end sides of corresponding one of the Hi-Fix boards 271*a* to 271*c*.

As for the rotational clamping units 620, their cylinders 621 are operated to make their piston rods 621*a* move forward. The linear movements of the piston rods 621*a* are converted into circular movements via the connection links 623 by the quadrangular link mechanism. As a result, the clampers 622 are made to rotate about their centers 'A', while clamping the facing end sides of the Hi-Fix boars 271*a*, 271*b* and 271*b*, 271*c* together or clamping the upper end side of the Hi-Fix board 271*a* and the lower end side of the Hi-Fix board 271*c*.

Thorough the above operations, it is possible to clamp the upper and the lower end sides of the Hi-Fix boards 271*a* to 271*c* as well as their left and right end sides. Thus, it is possible to prevent the problem that the portions of the Hi-Fix boards 271*a* to 271*c* near their central lines become unfastened from the test handler.

In the above explanation, though the linear clamping units 610 are adopted for clamping the left and the right end sides of the Hi-Fix boards 271*a* to 271*c* and the rotational clamping units 620 are employed clamping the upper and the lower end side of the Hi-Fix board 271*a* and 271*c*, respectively, either one of the linear clamping units and the rotational clamping units can be selectively employed for the clamping of the left and the right end sides of the Hi-Fix boards 271*a* to 271*c* and for the clamping of end side of the Hi-Fix board 271*a*. That is, for clamping the Hi-Fix boards' sides other than the facing sides therebetween, it is possible to selectively employ either one of the linear clamping unit or the rotational clamping unit.

In accordance with the embodiment of the present invention, all the end sides of the Hi-Fix boards can be clamped by the clamping apparatus of the present invention, and, thus, the central portions of the Hi-Fix boards can be prevented from being unfastened from the test handler. Thus, the enlargement of the size of the test trays is enabled, and the number of semiconductor devices that can be tested at one time can be increased.

While the invention has been shown and described with respect to the exemplary embodiment, it will be understood by those skilled in the art that various changes and modifications may be made without departing form the spirit and scope of the invention as defined in the following claims.

What is claimed is:

1. A clamping apparatus for use in test handlers, wherein the clamping apparatus clamps two or more Hi-Fix boards arranged in a row, the apparatus comprising:

at least one first clamping unit installed to simultaneously clamp facing end sides of two adjacent Hi-Fix boards among said two or more Hi-Fix boards; and a plurality of second clamping units each of which is installed to clamp an end side of one of said two or more Hi-Fix boards, wherein the end side does not face other Hi-Fix boards, wherein the first clamping unit includes:

a clamper installed to rotate about a fixed rotation point to simultaneously clamp or release the clamping of the facing end sides of said two adjacent Hi-Fix boards, the rotation point being disposed between the facing end sides of said two adjacent Hi-Fix boards; and a driving unit for providing a rotational force to the clamper, wherein the driving unit includes a cylinder which is not disposed between the facing end sides of said two adjacent Hi-Fix boards but disposed in parallel to extended lines of the facing end sides; and wherein the driving unit further includes a connection link and a piston rod moving forward and backward by the cylinder, the connection link having one end rotatably connected to the piston rod and other end rotatably connected to the clamper at a position deviated from the rotation point of the clamper by a preset interval.

2. The apparatus of claim 1, wherein the second clamping units include linear clamping units, each linear clamping unit having a linear clamper which moves forward to clamp a left or a right end side of one of said two or more Hi-Fix boards.

3. The apparatus of claim 2, wherein the second clamping units further include rotational clamping units, each rotational clamping unit having a rotational clamper which rotates about a center thereof to clamp an upper or a lower end side of one of said two or more Hi-Fix boards.

* * * * *